US007700398B2

(12) United States Patent
Pinnow (10) Patent No.: US 7,700,398 B2
(45) Date of Patent: Apr. 20, 2010

(54) METHOD FOR FABRICATING AN INTEGRATED DEVICE COMPRISING A STRUCTURE WITH A SOLID ELECTROLYTE

(75) Inventor: Cay-Uwe Pinnow, Munich (DE)

(73) Assignee: Infineon Technologies AG, Munich (DE)

( * ) Notice: Subject to any disclaimer, the term of this patent is extended or adjusted under 35 U.S.C. 154(b) by 1057 days.

(21) Appl. No.: 11/197,746

(22) Filed: Aug. 5, 2005

(65) Prior Publication Data

US 2007/0029538 A1 Feb. 8, 2007

(51) Int. Cl.
*H01L 21/00* (2006.01)
(52) U.S. Cl. .................. 438/84; 438/95; 438/102; 438/103
(58) Field of Classification Search .............. 438/84, 438/95, 102, 103
See application file for complete search history.

(56) References Cited

U.S. PATENT DOCUMENTS

| 4,163,982 | A | | 8/1979 | Di Domenico, Jr. | |
| 5,509,189 | A | * | 4/1996 | Tuller et al. | 29/623.1 |
| 6,936,840 | B2 | * | 8/2005 | Sun et al. | 257/30 |

FOREIGN PATENT DOCUMENTS

EP 1536474 A2 6/2005

WO WO-2005/024839 A1 3/2005

OTHER PUBLICATIONS

R. Symanczyk, "Electrical Characterization of Solid State Ionic Memory Elements," in Proceedings of the Non-Volatile Memory Technology Symposium, San Diego, USA, 17-1, Nov. 2003.
M.N. Kozicki et al., "Applications of Programmable Resistance Changes in Metal-Doped Chalcogenides," Electrochemical Society Proceedings, vol. 99-13, pp. 298, 1999.
M.N. Kozicki et al., "Can Solid State Electrochemistry Eliminate the Memory Scaling Quandary?," Proc. VLSI, 2002.
M.N. Kozicki et al., "Nanoscale Effects in Devices Based on . . . ," Superlatttices and Microstructures, vol. 27, No. 5/6, p. 485, 2000.
R. Neale, "Micron To Look Again At Non-Volatile Amorphous Memory," Electronic Engineering Design, 2002.
Y. Wang et al., "Macroscopic Phase Separation of Se-Rich . . . ," J. Phys.: Condens. Matter, 15, pp. 1573-1584, (2003).
H. Okamoto, Ge-Se (Germanium-Selenium), Journal of Phase Equilibria, vol. 21, No. 3, p. 313, 2000.
Company Presentation—PMCm, "An Introduction to Programmable Metallization Cell Memory Devices", Axon Technologies Corporation, Jul. 28, 2004.

* cited by examiner

*Primary Examiner*—Thien F Tran
(74) *Attorney, Agent, or Firm*—Patterson & Sheridan, L.L.P.

(57) ABSTRACT

Method for fabricating an integrated device, comprising the step of providing a substrate, which includes an electrode element, and a step of providing a solid electrolyte element coupled to the electrode element. The solid electrolyte element is provided in a crystalline state and in conjunction with electrode element such to form a programmable resistance element. The method furthermore comprises a heating process, after providing the solid electrolyte element.

28 Claims, 5 Drawing Sheets

METHOD FOR FABRICATING AN INTEGRATED DEVICE COMPRISING A STRUCTURE WITH A SOLID ELECTROLYTE

BACKGROUND OF THE INVENTION

1. Field of the Invention

The present invention relates to a method for fabricating an integrated device comprising a structure with a programmable resistance including a solid electrolyte.

2. Description of the Related Art

Demands to data memories are steadily increasing with regard to the density of information, i.e. how much information can be stored per unit area, access time, i.e. how fast a memory element may be accessed, and non-volatility, i.e. whether the memory content can be reliably maintained even without supplying energy. In conventional electronic data memories, such as DRAM or Flash RAM, often a capacitor stores a unit of information, whereas only the latter type, the Flash RAM, is able to hold a memory content over a considerable amount of time without the need of supplying energy.

In this kind of data memories, a distinction is made between a charged capacitor state and an uncharged capacitor state, with these two states representing the possible bits of information "1" and "0". Apart from capacitors, additional components, such as selection transistors, are necessary for operating the memory. These components are defined by imaging lithographic processes and structuring techniques, such as etching or damascene processes. A very common manufacturing process in the semiconductor industry for manufacturing memory devices, integrated circuits, and microprocessors is the so-called CMOS process, in which all functional components are realized on a single substrate. The complete integration of functional electronic units, including transistors, resistors and capacitors, is obtained by the use of additional material such as metals, dopants and dielectrics.

In order to combine non-volatility with speed and integration, alternatives to the DRAM and the Flash RAM are subject to intense scientific and industrial research. Alternative approaches range from mechanical memories employing scanning probes over optical concepts to ultra-fast magnetic data storage. As far as the integration into existing manufacturing processes and technologies is concerned, the so-called resistive memories are most promising.

In a resistive memory, a local and stable change of the electric conductivity is achieved by electric signals and is read out with an electric current, where, for example, a high and a low resistive state correspond to the information units "0" and "1", respectively. Prominent members of resistive memory media are the so-called solid electrolytes, in which metal ions are mobile and can hence migrate therein. Charged metal ions can therefore be positioned by means of an electric field to form a conductive bridge in the carrier electrolyte. In this way, they form a domain with an increased electric conductivity in the otherwise insulating carrier electrolyte. These conductive bridgings are stable over long time spans in the range of several years. Furthermore, it is possible to decompose a conductive bridging by applying an electric field with reversed polarity, and the ions are led back into one of the facing electrodes. The entire process is completely reversible, and, moreover, satisfying extrapolated retention times of more than ten years as well as a sufficient endurance of about $10^5$ cycles have already been shown, e.g. by R. Symanczyk, in Proceedings of the Non-volatile Memory Technology Symposium, 17-1, San Diego (U.S.A.), November 2003.

Besides these encouraging results, problems remain, above all, problems of efficient manufacturing of such devices. In recent decades, semiconductor industry has established highly efficient and very reliable manufacturing processes, such as the CMOS process. It is most desirable to be able to integrate new resistive memory media into this process. In this manner, endurance and non-volatility of resistive memory media can be combined with the high integration power of the CMOS process to form a high performance data memory device that holds its information content over a long time span without requiring energy.

Solid electrolytes, however, require additional doping to provide a sufficient mobility of the metal ions at room temperature. As an example, silver can be dissolved in germanium-sulfide or germanium-selenide solid electrolytes to form a good room temperature electrolyte, as discussed at http://www.axontc.com/images/axontc.pdf. Although the addition of silver is very advantageous, as far as the solid electrolyte properties are concerned, a doped solid electrolyte is often rendered inoperative by specific steps of the CMOS production process. Particularly, process steps with elevated temperatures, which are an integral part of the CMOS process for annealing semiconductors or forming passivating seals, cause the dopant in the solid electrolyte to form a stable compound with the constituents of the solid electrolyte.

In the case of silver (Ag) and germanium-selenide (GeSe), for example, a GeSeAg-argyrodite is formed when temperatures above a certain critical value are applied. The said argyrodite does not possess any solid electrolyte properties and holds the metal immobile, in this case silver, at fixed lattice sites. Therefore, it is impossible for the metal ions to migrate and hence to form a conductive bridging. The reason why the mobility is lost lies in the fact that during long exposures to high temperatures of the material system, the dopant material can migrate within the thitherto electrolyte, and can then form stable chemical bonds with the electrolyte to yield a new crystalline phase.

In summary, it is impossible to integrate a doped solid electrolyte into a device, employing a CMOS manufacturing process with an extended heating process for completing the device.

SUMMARY OF THE INVENTION

It is an object of the present invention to provide the integration of solid electrolytes into existing manufacturing processes for integrated devices, without affecting the operability of the solid electrolyte. It is a further object of the invention to provide an integrated device, having a solid electrolyte, which can be manufactured by means of a standard manufacturing process.

According to a first aspect of the present invention a method is provided for fabricating an integrated device, comprising the steps of providing the substrate with an electrode element and providing a solid electrolyte element coupled to the electrode element. The solid electrolyte element and the electrode element are provided such to form a programmable resistance element, wherein the solid electrolyte is provided in a crystalline state. Furthermore, a heating process is applied, as part of a succeeding process step for the completion of the integrated device, after providing the solid electrolyte element.

A modern manufacturing process for integrated devices, such as the so-called CMOS process, requires a set of process stages, also including at least one heating process. An extensive heating process is usually carried out towards the end of a CMOS manufacturing process, which is also referred to as the so-called back end of line (BEOL). Unfortunately, metal doped solid electrolyte materials may loose their electrolyte properties when heated over an extended period of time. The inventive method has the advantage of enabling the integration of solid electrolyte material into existing and established manufacturing processes.

According to an embodiment of the present invention, the solid electrolyte is provided in a crystalline state before applying a heating process. The crystalline state of the solid electrolyte strongly suppresses the formation of a stable non-electrolyte compound, consisting of both the solid electrolyte constituents and the diffusing material, having no solid electrolyte properties.

According to the inventive method, the property of a programmable resistance is preserved within the programmable resistance element during and after the heating process. Particularly, the inventive method allows for the integration of solid electrolyte material into a CMOS manufacturing process and hence allows for a highly increased performance of several types of integrated devices such as non-volatile data memory devices and programmable logic devices.

In a further embodiment of the present invention, the crystalline state of the solid electrolyte element is provided in such a way that a programmable resistance property of the programmable resistance element is maintained during and after the heating process. The programmable resistance element hence keeps its programmable resistance property, that the resistance of the element can be changed by applying electric signals, these changes being reversible and being persistent in the element even without supplying energy.

In a further embodiment of the present invention, the crystallinity of the solid electrolyte element is such that the programmable resistance element possesses a programmable resistance property after the heating process. Hence, the resistance of the programmable resistance element can be changed by applying electric signals, these changes being reversible and being persistent in the element even without supplying energy.

According to a further embodiment of the present invention, the heating process is for annealing doped regions in a semiconductor element of the integrated device and for forming a passivating seal on the top surface of the integrated device. The semiconductor element is defined by implanting dopants into a semiconductor crystal. The crystal lattice is severely damaged by this high-energy implantation, and hence must be annealed in order to render the semiconductor element functional. Furthermore, a passivating seal can be formed by exposing a top material to a specific gas at high temperatures to convert it into a inert passive material. In a CMOS process, commonly silicon is transferred into silica in an oxygen or water vapor atmosphere at high temperatures.

The solid electrolyte may be provided in a mono-crystalline state, such that the solid electrolyte may be regarded as a single crystal over the entire solid electrolyte element. The solid electrolyte may be also provided in a poly-crystalline state, such that within the solid electrolyte element the solid electrolyte forms more than one crystalline domain. Furthermore, the solid electrolyte may be provided in a nano-crystalline state, such that the said crystalline domains of the solid electrolyte within the solid electrolyte element have spatial dimensions in the range of 2 to 200 nm.

In a further embodiment of the present invention, the method for fabricating an integrated device is provided as being embedded into a CMOS fabricating process. This allows for the integration of solid electrolyte material into a CMOS manufacturing process and hence allows for a highly increased performance of the integrated devices.

According to a next aspect of the present invention a method is provided for fabricating an integrated device, comprising the steps of providing a substrate with an electrode element and providing a solid electrolyte element coupled to the electrode element. The solid electrolyte element and the electrode element are provided such to form a programmable resistance element. The step of providing the solid electrolyte element comprises a step of providing the solid electrolyte element in an amorphous state and a step of rendering the solid electrolyte element crystalline.

According to this aspect of the present invention, the solid electrolyte element is initially provided in an amorphous state, allowing for a broad range of structuring and depositing techniques. In a subsequent step, the solid electrolyte element is rendered crystalline. The splitting of the step of providing the solid electrolyte element in a crystalline state into these two steps simplifies the manufacturing of the integrated device by allowing for the provision of the solid electrolyte without restrictions. Furthermore, a heating process is applied, as part of a subsequent process step for the completion of the integrated device, after providing the solid electrolyte element.

According to an embodiment of this aspect, additional steps such as a step of implanting a metal into the solid electrolyte element may be carried out while the solid electrolyte element is still in an amorphous state, and is transferred into a crystalline state only afterwards. As far as the implantation of a metal into the solid electrolyte is concerned, this implantation may also be performed after the solid electrolyte element has been rendered crystalline.

According to a further embodiment, the step of implanting a metal into the solid electrolyte element comprises the steps of providing a metal adjacent to the solid electrolyte element, driving the metal into the solid electrolyte element, and removing the remaining metal adjacent to the solid electrolyte element. After the provision of the adjacent metal, an exposure to a high energy light may drive the metal into the electrolyte, which forms metal precipitates within the solid electrolyte. All metal which has not been implanted into the solid electrolyte is removed afterwards, and hence cannot participate in forming stable bonds with the solid electrolyte constituents at the solid electrolyte interfaces.

In a further embodiment of the present invention, the method for fabricating an integrated device includes a rapid temperature process with a pre-determined temperature profile versus time, for rendering the solid electrolyte element crystalline. In this way, the phase or physical structure of the solid electrolyte element may be changed, while not providing enough time for undesired diffusion within the solid electrolyte. In a rapid temperature process, the initially amorphous solid electrolyte can be rendered crystalline, even if it already contains precipitates of a metal or another dopant. Since the time span of a rapid temperature process is short, a stable (ternary) compound of the solid electrolyte constituents with the dopant, material from precipitates, or with electrode material cannot be formed, and hence the solid electrolyte properties are preserved. Furthermore, since the solid electrolyte has been rendered crystalline, it now also survives a heating process over an extended period of time, since the crystalline structure strongly inhibits the formation of a stable non-electrolyte compound.

The rapid temperature process may comprise a heating stage, a temperature plateau stage, during which the process temperature is kept constant over a well-defined period of time, and a cooling stage. During the heating stage, the device may be rapidly heated with a heating rate in the range from 5 to 100 Kelvin per second. The process temperature which is kept constant during the temperature plateau stage may be typically in the range of 400° C. to 700° C. with a duration ranging from 5 to 400 seconds. During the cooling stage, the device may be cooled down to an adequate ambient temperature with a cooling rate comparable to the heating rate, ranging from 5 to 100 Kelvin per second.

In a further embodiment of the present invention, the solid electrolyte may be rendered mono-crystalline, such that the solid electrolyte may be regarded as a single crystal over the entire solid electrolyte element. The solid electrolyte may be also rendered poly-crystalline, such that within the solid electrolyte element the solid electrolyte forms more than one crystalline domain. Furthermore, the solid electrolyte may be rendered nano-crystalline, such that the said crystalline domains of the solid electrolyte within the solid electrolyte element have spatial dimensions in the range of 2 to 200 nm.

In a further embodiment of the present invention, the method for fabricating an integrated device is provided as being embedded into a CMOS fabricating process. This allows for the integration of solid electrolyte material into a CMOS manufacturing process and hence allows for a highly increased performance of the integrated devices.

According to a next aspect of the present invention a method is provided for fabricating an integrated device, comprising the steps of providing the substrate with an electrode element and providing a solid electrolyte element coupled to the electrode element. The solid electrolyte element and the electrode element are provided such to form a programmable resistance element. The solid electrolyte element is provided by means of applying a vapor deposition process, such as chemical vapor deposition (CVD), physical vapor deposition (PVD). Furthermore, a heating process is applied, as part of a succeeding process step for the completion of the integrated device, after providing the solid electrolyte element.

The said deposition techniques provide a broad range of the resulting material properties and qualities of the deposited material, including materials in an amorphous state as well as in a crystalline state such as mono-, poly-, multi-, or nano-crystalline material.

According to an embodiment of this aspect of the present invention, the method for fabricating an integrated device is provided as being embedded into a CMOS fabricating process.

According to a next aspect of the present invention a method is provided for fabricating an integrated device, comprising the steps of providing the substrate with an electrode element and providing a solid electrolyte element coupled to the electrode element. The solid electrolyte element and the electrode element are provided such to form a programmable resistance element. The solid electrolyte element is provided by means of applying a molecular beam deposition process, such as molecular beam epitaxy (MBE). Furthermore, a heating process is applied, as part of a succeeding process step for the completion of the integrated device, after providing the solid electrolyte element.

Molecular beam deposition techniques provide a broad range of the resulting material properties and qualities of the deposited material, including material in an amorphous state as well as in a crystalline state such as mono-, poly-, multi-, or nano-crystalline material.

According to an embodiment of this aspect of the present invention, the method for fabricating an integrated device is provided as being embedded into a CMOS fabricating process.

In an embodiment of the first aspect of the present invention, the method for fabricating an integrated device comprises the provision of a solid electrolyte element including chalcogenides, particularly a compound such as germanium-selenide (GeSe, GeSe$_2$), germanium-sulfide (GeS, GeS$_2$), germanium-telluride (GeTe), silicon-selenide (SiSe), silicon-sulfide (SiS), lead-sulfide (PbS), lead-selenide (PbSe), lead-telluride (PbTe), tin-sulfide (SnS), tin-selenide (SnSe), tin-telluride (SnTe), zinc-sulfide (ZnS), zinc-selenide (ZnSe), cadmium-sulfide (CdS), cadmium-selenide (CdSe), or mixtures of said compounds. Furthermore, one of the metals copper (Cu), silver (Ag), zinc (Zn), lithium (Li), or sodium (Na) may be implanted as a precipitate within the solid electrolyte element.

According to another embodiment, the electrode element is provided to include at least one of the metals copper, silver, zinc, lithium, or sodium.

According to another aspect of the present invention an integrated device is provided, comprising a substrate, an electrode element, and a solid electrolyte element. The solid electrolyte element is coupled to the electrode element, such as to form a programmable resistance element, wherein the solid electrolyte is provided in a crystalline state. The crystalline state of the solid electrolyte is such that the programmable resistance element maintains its programmable resistance property after exposure to a heating process. Since the solid electrolyte element is part of an integrated device which is manufactured by a process consisting of several process steps, the integration of a solid electrolyte element into an integrated device is only feasible if the solid electrolyte is not rendered inoperable by one of the process steps, particularly a heating process. The inventive integrated device provides the solid electrolyte element in a crystalline state, such that all the solid electrolyte properties are preserved during and after exposure to a heating process.

According to an embodiment of this aspect, the solid electrolyte element is provided in a mono-, poly-, multi- or nano-crystalline state.

In an embodiment of this aspect of the present invention, the solid electrolyte element includes a chalcogenide, particularly at least one of the compounds germanium-selenide (GeSe, GeSe$_2$), germanium-sulfide (GeS, GeS$_2$), germanium-telluride (GeTe), silicon-selenide (SiSe), silicon-sulfide (SiS), lead-sulfide (PbS), lead-selenide (PbSe), lead-telluride (PbTe), tin-sulfide (SnS), tin-selenide (SnSe), tin-telluride (SnTe), zinc-sulfide (ZnS), zinc-selenide (ZnSe), cadmium-sulfide (CdS), cadmium-selenide (CdSe), or mixtures of said compounds. Furthermore, one of the metals copper (Cu), silver (Ag), zinc (Zn), lithium (Li), or sodium (Na) may be implanted as a precipitate within the solid electrolyte element.

According to another embodiment, the electrode element includes at least one of the metals copper, silver, zinc, lithium, or sodium.

BRIEF DESCRIPTION OF THE DRAWINGS

These and other objects and features of the present invention will become clear from the following description taken in conjunction with the accompanying drawings in which.

DESCRIPTION OF THE PREFERRED EMBODIMENTS

Figure 1:
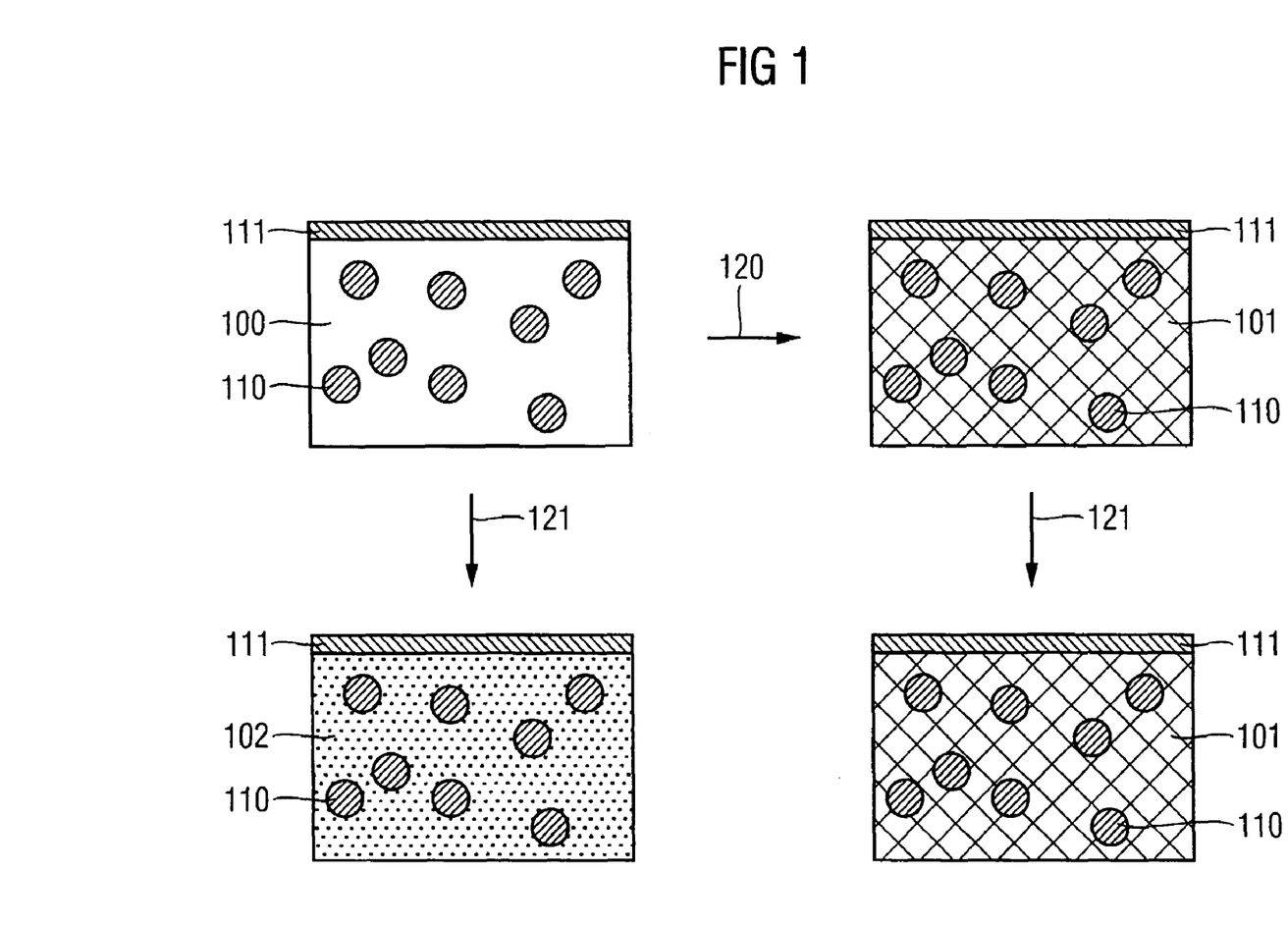
FIG. 1 shows a schematic view of a solid electrolyte element, according to a first embodiment of the present invention.

FIG. 1 shows a schematic illustration of the property and material changes of a solid electrolyte element 100, which is initially in an amorphous or partially amorphous state, with metal precipitates 110 and an electrode 111.

In this context, an amorphous state of a material is defined as a state in which the atoms of the solid electrolyte are arranged in an amorphous manner, i.e. without a well-defined periodic arrangement or without domains in which the atoms are arranged in a periodic manner. Amorphous materials do not possess a long range order, typical diffraction measurements therefore lack sharp diffraction peaks.

The solid electrolyte element 100 is exposed, after implantation of the metal precipitates 110, to a thermal budget of a CMOS back end of line (BEOL) 121. This implies exposure of the solid electrolyte element 100 to an extended heating process with a duration, such that the metal contained in the precipitates 110 or in the electrode 111 has enough time to migrate within the solid electrolyte element 100 and to form a stable compound with the constituents of the solid electrolyte element 100. The duration of the extended heating process depends on the heating temperature and lasts preferably more than 30 minutes and up to several hours. If the solid electrolyte element 100 initially contains a chalcogenide, such as germanium-selenide (GeSe) or germanium-sulfide (GeS), and the precipitates 110 contain a metal, e.g. silver, a ternary compound, such as $Ag_8GeSe_6$ or $Ag_8GeS_6$ respectively, is formed. The solid electrolyte element 102 after the BEOL heating process hence may contain the said ternary compounds, which are also known as so called argyrodites following the above example, and, most importantly, the solid electrolyte element 102 has in this way lost its solid electrolyte properties. The formation of conductive bridgings, in the sense of a programmable resistance element, by inserting and removing metal ions into and from the solid electrolyte element 102 is now strongly suppressed. The solid electrolyte element 102 has been rendered inoperable by the BEOL thermal budget 121.

However, if the solid electrolyte element 100 is rendered a solid electrolyte element 101 with a solid electrolyte in a crystalline state by an interstitial process 120, diffusion and hence migration of metal from the precipitates 110 within the solid electrolyte element 101 is strongly suppressed.

In this context, a crystalline state of the solid electrolyte implies that the solid electrolyte material comprises at least one domain in which the atoms of the material are arranged in a periodic manner. Particularly, the crystalline state in this context comprises a mono-crystalline state in which the domain of a periodic arrangement of the constituent atoms spans over the entire element, as well as a poly-crystalline state, in which the element consists of several domains in which the constituent atoms are again arranged in a periodic manner.

Furthermore, the poly-crystalline state comprises also a nano-crystalline state which can be understood as a crystalline state, in which the domains of a poly-crystalline material have a size in the range of 2 to 100 nm. Since the feature size of modern integrated devices has already approached the dimension of a few nanometres, an element initially provided as nano-crystalline may result in an element of the material which possesses only one or a few crystalline domains after structuring, and can hence be referred to as a mono- or poly-crystalline entity. In addition, a crystalline state in the context of the present invention may also be understood as a part of the element being in a said crystalline state and the remainder of the material being in an amorphous state. The majority of the element however, preferably at least 90% of the element, shall be provided in a crystalline state according to the present inventive method.

The interstitial process 120 may comprise a rapid temperature process (RTP), in which the integrated device is rapidly heated to maximum temperature $T_{max}$, this temperature $T_{max}$ being kept constant for a certain amount of time, and then rapidly cooled down to an adequate ambient temperature $T_R$.

Figure 2:
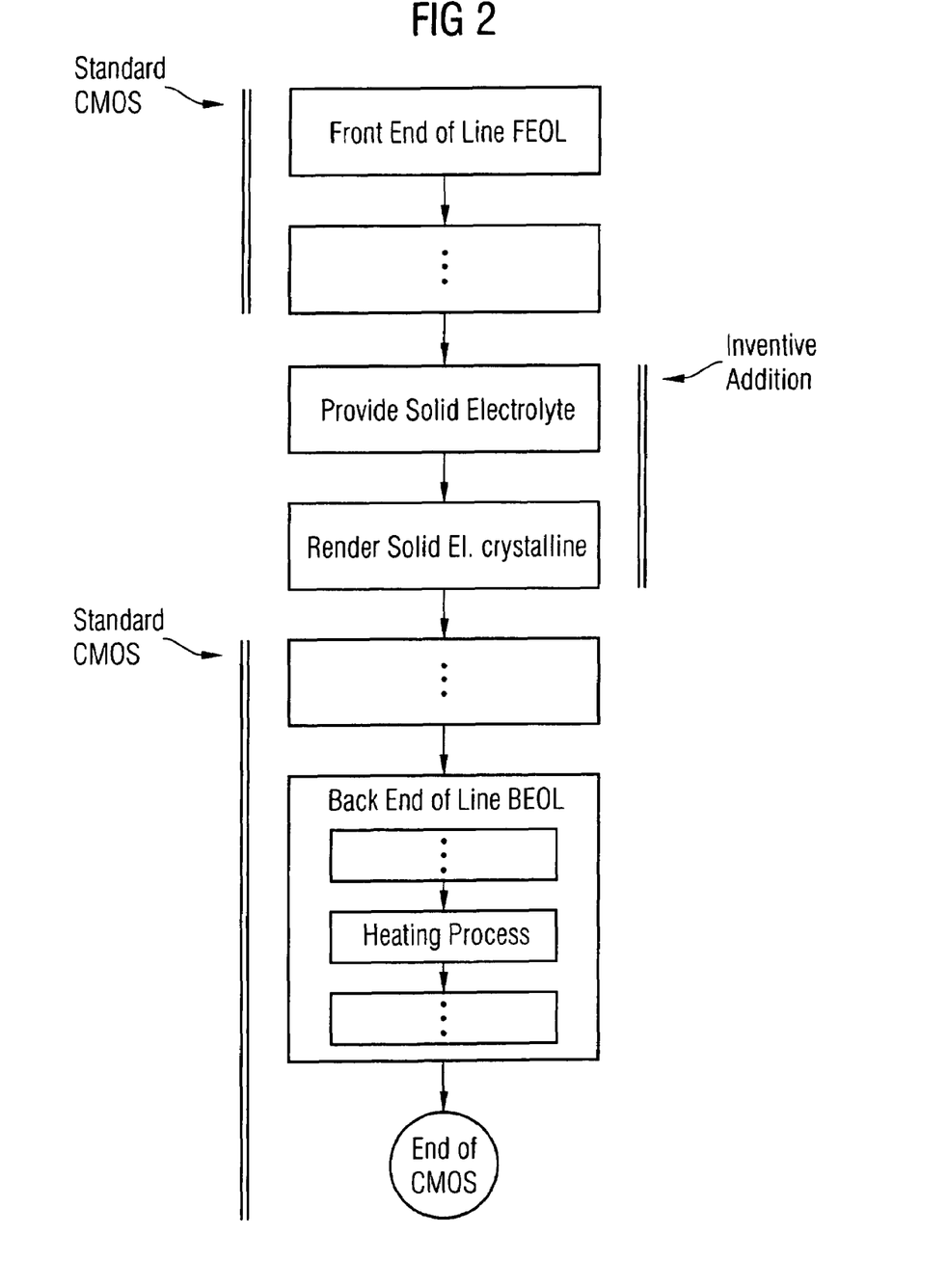
FIG. 2 shows a flow chart of the inventive method, according to the first embodiment of the present invention.

FIG. 2 shows the first embodiment of the inventive method as a flow chart, illustrating a CMOS production process. Manufacturing of an integrated device using a CMOS process usually starts with the so-called front-end of line (FEOL), which is defined as including all process steps before first metallization. Furthermore, all process steps following first metallization in a CMOS process are referred to as the so-called back-end of line (BEOL), which particularly includes a said extended heating process. During this heating process, for instance, all semiconductor structures may be cured by annealing the semiconductor substrate in a particular gas ambient (e.g. forming gas). Extended heating may also be caused during the formation of passivating layers, including e.g. borophosphosilicate glass or silicon-nitride. Furthermore, the extended heating process may be part of a metallization process or other processes after the provision of the solid electrolyte. However, this extended heating process destroys the solid electrolyte properties of respective material, which has been deposited before the BEOL, as already noted in conjunction with the description of FIG. 1.

This embodiment of the inventive method therefore provides additional process steps to be included into the CMOS sequence, these additional process steps being fully compatible to established CMOS processing techniques. In this embodiment of the inventive method, the solid electrolyte is provided in an amorphous form via a deposition technique, such as chemical or physical vapor deposition, in short CVD or PVD, respectively, or like sputtering. The solid electrolyte is then rendered a solid electrolyte in a crystalline state in the sense of the present invention.

For enhancing the solid electrolyte properties, a third material, for example silver, is doped into the solid electrolyte, such as germanium-selenide. Enhanced solid electrolyte properties can be understood in this context as an enhanced mobility for metal ions within the solid electrolyte and stable formation of conductive bridgings. The dopant material may be brought into the electrolyte after or before the electrolyte is rendered crystalline. The transition from the initially amorphous state to a crystalline state of the solid electrolyte can be achieved by so-called rapid temperature processing (RTP). In an RTP process, the device is subject to high temperatures for reduced time spans, featuring high heating and cooling rates in the range of 5 to 100 Kelvin per second. With such a process, the compounds of the solid electrolyte can undergo the transition to a global or local crystalline structure, whereas the process duration is selected to be not long enough to allow a metal to diffuse within the solid electrolyte and hence the formation of a stable ternary compound without solid electrolyte properties is prevented.

When the doped solid electrolyte has a crystalline structure, the evolution of another crystalline phase (recrystallization) is strongly inhibited, and even if the electrolyte structure is exposed to high temperatures of an extended heating process, the metal does not migrate to form stable chemical bonds with the electrolyte constituents. It is therefore possible to conserve solid electrolyte properties during and after an entire CMOS manufacturing process. Hence, full advantage can be drawn from an ion conducting electrolyte carrier material in combination with the ultra-high integration of a modern CMOS process. In this manner, not only high performance non-volatile memory devices can be realized, but also programmable logic and self-repairing electronic devices are feasible. In latter devices, conducting paths can be deliberately formed in a ready device to either define a desired logic connection or to circumvent destroyed or flawed connection lines.

FIG. 3 illustrates the integrated device during manufacturing, applying the first embodiment of the inventive method. FIG. 3A shows schematically the integrated device 10 with three sections of the substrate 1, the left section of the substrate 1 already containing a doped region 2 of a semiconductor. The region 2 of a semiconductor may be in the substrate 1 itself or within an additional layer of semiconductor material on top of the substrate 1.

Figure 3A:
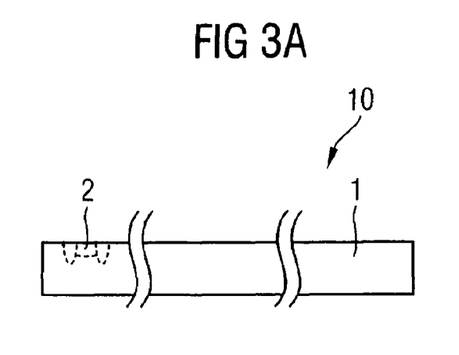
FIG. 3 illustrates the integrated device during the manufacturing process according to the first embodiment of the inventive method.
Figure 3B:
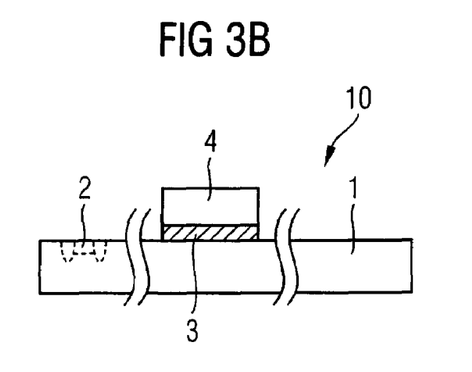

Subsequently, further steps (not shown) may be carried out as part of a CMOS front end of line. Before or after first metallization, an electrode 3 and a solid electrolyte 4 are deposited onto the substrate 1, as shown in FIG. 3B. The electrode 3 is coupled to the electrolyte 4, usually arranged adjacent to each other. In this view, only the central section is covered by the electrode 3 and the solid electrolyte 4. Nevertheless, both the electrode 3 and the solid electrolyte 4 can be applied on other parts of the substrate 1 or the entire substrate 1.

Figure 3C:
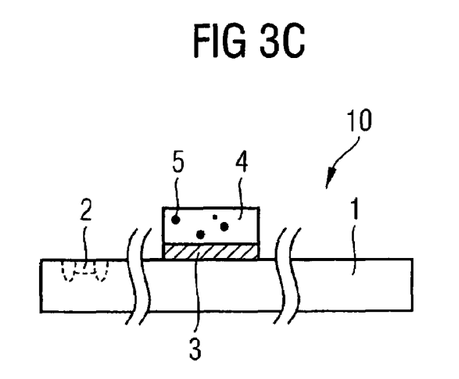

In a subsequent step, the solid electrolyte 4 is doped with a metal to form precipitates 5 within the solid electrolyte 4. The solid electrolyte 4 is shown in FIG. 3C with the formed precipitates 5. The formation of the precipitates is normally achieved by depositing a layer of the dopant on top of the solid electrolyte and by subsequent exposure to a high energy light, which drives the metal into the electrolyte to form the precipitates 5. The precipitates 5 comprise a binary compound of the metal with one of the electrolyte compounds, e.g. the precipitates 5 contain silver-selenide or silver-sulfide in the case of a dopant silver within a carrier electrolyte germanium-selenide or germanium-sulfide, respectively. The remainder of the deposited metal is removed after this photo-assisted doping process.

Figure 3D:
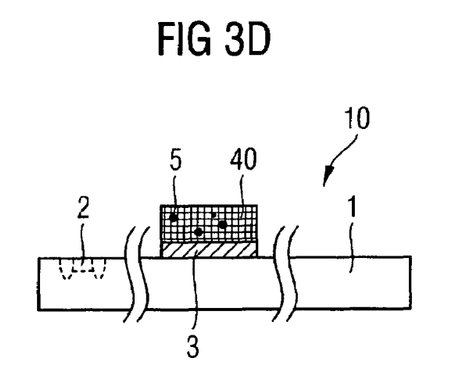

In the next step, the solid electrolyte 4 is rendered crystalline to form the modified solid electrolyte layer 40 as shown in FIG. 3D. In principle, the process step of rendering the solid electrolyte crystalline can take place before doping, as well. The metal precipitates 5 can be brought into the solid electrolyte layer 4 regardless of its amorphous or crystalline structure.

Figure 3E:
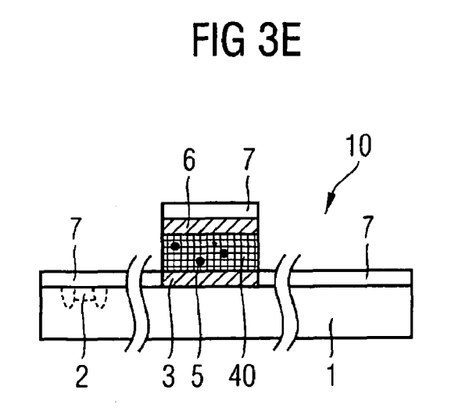

In FIG. 3E, the integrated device 10 is shown after an additional electrode layer 6 and a sealing layer 7 have been deposited onto the device. Toward the end of a CMOS process, the layer 7 frequently consists of amorphous silica or silicon nitride.

Figure 3F:
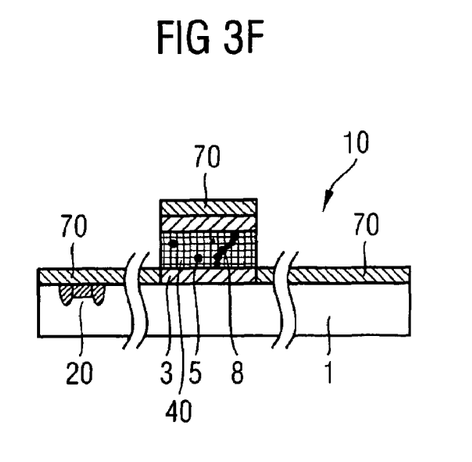

FIG. 3F shows the integrated device 10 after BEOL processing, including an extended heating process which usually serves multiple purposes, such as activating semiconductor structures 2 to form functional structures 20, and to transform the top silicon 7 in an oxygen or water vapor atmosphere into a passivating layer of silica 70. According to an embodiment of the inventive method, the solid electrolyte layer 40 survives the BEOL thermal budget, and the electrolyte properties are conserved. In this way, metal ions are still mobile enough to migrate within the layer 40 to form a conductive bridging 8 among the precipitates 5. Without application of the inventive method to render the solid electrolyte crystalline before the BEOL part of the CMOS process is carried out, the metal in the precipitates 5 would have formed a stable ternary compound with the material of the solid electrolyte 4, resulting in a breakdown of programmable resistance properties of the combined material system 4 and 5.

Figure 4:
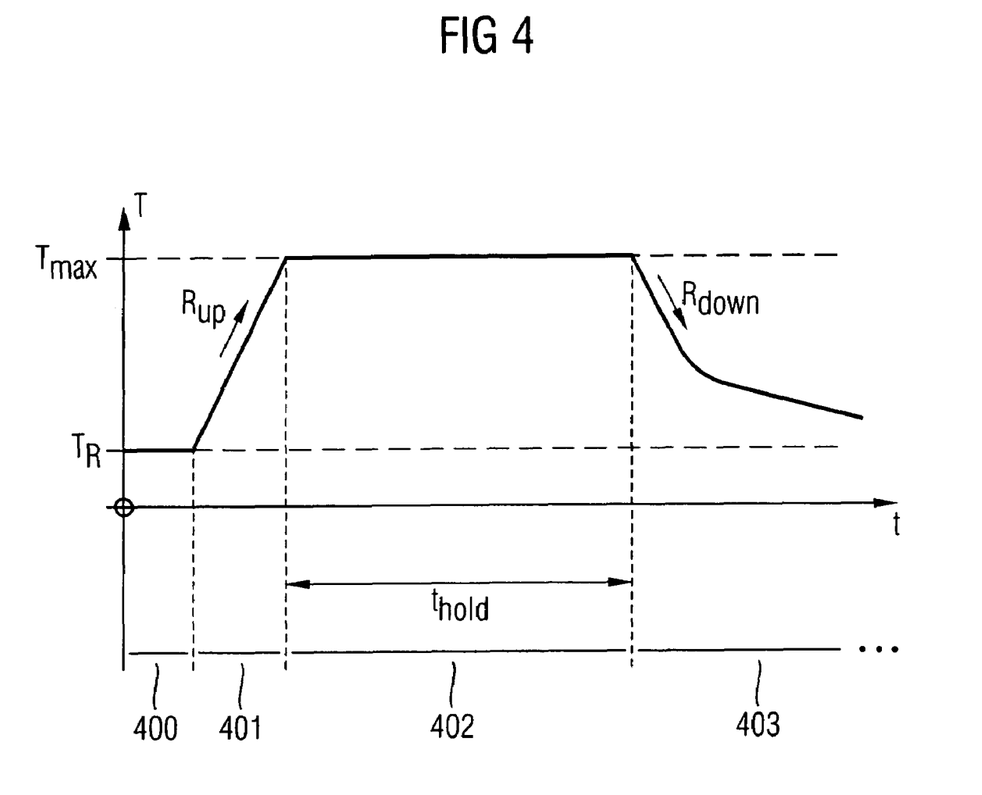
FIG. 4 illustrates a temperature profile vs. time of a rapid temperature process, according to the first embodiment of the present invention.

FIG. 4 shows a typical temperature profile of temperature T versus time t of a rapid temperature processing step, according to the first embodiment of the inventive method. During this RTP step, the integrated device is heated after an initialization stage 400 in a heating stage 401 to a temperature $T_{max}$. This maximum temperature $T_{max}$ is kept constant during a temperature plateau stage 402. In a subsequent cooling stage 403, the integrated device is cooled rapidly down to an adequate ambient temperature $T_R$.

In this embodiment of the inventive method, the heating stage 401 is carried out with a heating rate $R_{up}$ in the range of 5 K/s to 100 K/s, preferably in the range of 10 K/s to 50 K/s, and most preferably in the range of 10 K/s to 30 K/s. Typical temperatures $T_{max}$ during the temperature plateau stage lie in the range of 200° C. to 1000° C., preferably in the range of 300° C. to 800° C., and most preferably in the range of 400° C. to 650° C. The plateau stage 502 may last for a holding time $t_{hold}$ in the range of 1 s to 1000 s, preferably in the range of 5 s to 500 s, and most preferably in the range of 5 s to 300 s. During the cooling stage 403, the same rates $R_{down}$ apply as in the heating stage 401.

In an RTP stage, the integrated device is heated rapidly to a maximum process temperature $T_{max}$. According to the inventive method, the entire time span in which the device is kept at temperatures $T_{max}$ is selected to be not long enough to allow material from the precipitates or electrodes to diffuse within the solid electrolyte element to form any stable compounds which render the device inoperable. Nevertheless, $T_{max}$ is selected to be high enough to allow for a structural change of the solid electrolyte element. In the same way as RTP is usually applied to anneal a damaged crystal lattice by allowing the atomic bonds to rearrange, the high temperature enables the constituents of a material to arrange themselves in a periodic, and hence in a crystalline manner. Since also cooling of the device is carried out fast, a physical structure of a material is frozen in, and remains stable thereafter.

During a part of or during all stages 400 through 403, the integrated device may be exposed to a gaseous flux while RTP processing. This flux may contain inert gases, such as argon or nitrogen, as well as one or more compounds of the metal-solid electrolyte material system. In this way, material desorption due to the high process temperatures can be avoided by providing a sufficient partial pressure of the respective compound.

Figure 5:
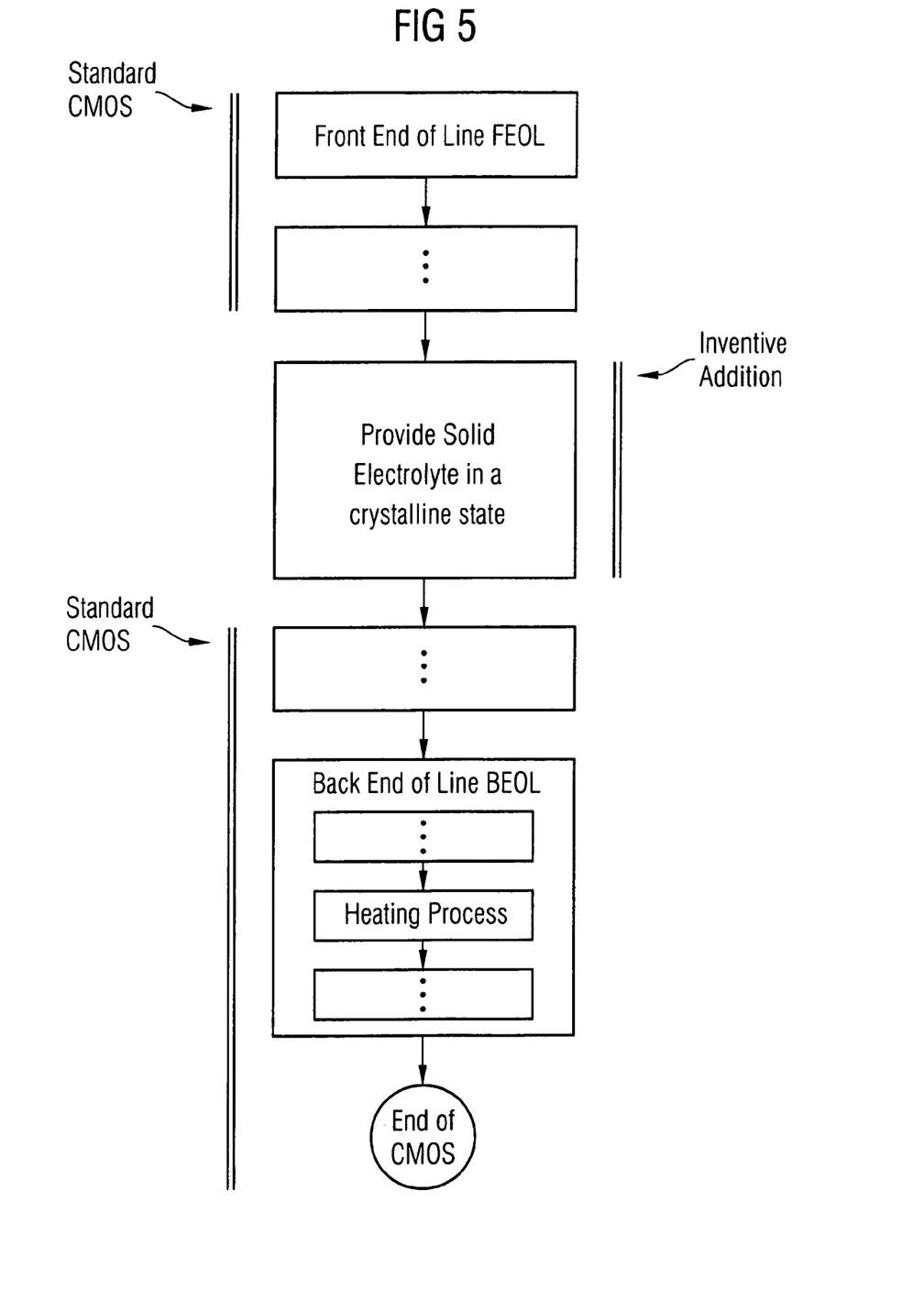
FIG. 5 shows a flow chart of the inventive method, according to a second embodiment of the present invention.

FIG. 5 shows a second embodiment of the inventive method as a flow chart. This second embodiment is a modification of the described first embodiment, illustrated in FIG. 2. According to the second embodiment, the solid electrolyte element is deposited in a crystalline state in a CMOS process after the FEOL and before the BEOL, in the sense of the present invention.

Modern deposition techniques, such as chemical vapor deposition, physical vapor deposition, and molecular beam epitaxy allow for the deposition of material, with a desired composition, purity, and physical structure. Particularly, it is possible to directly deposit material in a crystalline state. The advantage of this embodiment lies in a reduction of process stages and hence in the reduction of the total process and manufacturing time and cost.

If no intermediate stages between the steps of providing a solid electrolyte element in an amorphous state and the step of rendering the solid electrolyte element crystalline are necessary, the direct provision of a crystalline solid electrolyte element renders additional steps, such as a rapid temperature processing step, obsolete.

A suitable material system for the solid electrolyte of the present invention and especially of the presented first and second embodiments of the present invention, may be a chalcogenide solid electrolyte with a dopant metal within precipitates. Preferable chalcogenides include germanium-selenide (GeSe, $GeSe_2$), germanium-sulfide (GeS, $GeS_2$), germanium-telluride (GeTe), silicon-selenide (SiSe), silicon-sulfide (SiS), lead-sulfide (PbS), lead-selenide (PbSe), lead-telluride (PbTe), tin-sulfide (SnS), tin-selenide (SnSe), tin-telluride (SnTe), zinc-sulfide (ZnS), zinc-selenide (ZnSe), cadmium-sulfide (CdS), as well as cadmium-selenide (CdSe). Preferable dopant metals include copper (Cu), silver (Ag), zinc (Zn), lithium (Li), as well as sodium (Na). A very preferable material system for the solid electrolyte may be one of the following: germanium-sulfide and silver, germanium-selenide and silver, germanium-sulfide and copper, germanium-selenide and copper, silicon-sulfide and silver, silicon-selenide and silver, silicon-sulfide and copper, or silicon-selenide and copper.

What is claimed is:

1. Method for fabricating an integrated device, comprising:
   providing a substrate, including an electrode element;
   providing a solid electrolyte element coupled to the electrode element, thereby forming a programmable resistance element, and wherein the solid electrolyte element is rendered in a crystalline state by an interstitial process; and
   applying a heating process, after providing the solid electrolyte element.

2. Method as claimed in claim 1, wherein the crystalline state of the solid electrolyte element is provided to maintain a programmable resistance property of the programmable resistance element during and after the heating process.

3. Method as claimed in claim 1, wherein the crystallinity of the solid electrolyte element is such that the programmable resistance element after the heating process possesses a programmable resistance property.

4. Method as claimed in claim 1, wherein the heating process is performed at least for one of the purposes:
   to anneal a doped region of the integrated device; and
   to form a passivating seal.

5. Method as claimed in claim 1, wherein the solid electrolyte element is in a mono-crystalline state.

6. Method as claimed in claim 1, wherein the solid electrolyte element is in a poly-crystalline state.

7. Method as claimed in claim 1, wherein the solid electrolyte element is in a nano-crystalline state.

8. Method as claimed in claim 1, wherein the method for fabricating the integrated device is embedded into a CMOS fabricating process.

9. Method as claimed in claim 1, wherein the solid electrolyte element includes at least one of:
   Germanium-Selenide (GeSe, $GeSe_2$);
   Germanium-Sulfide (GeS, $GeS_2$);
   Germanium-Telluride (GeTe);
   Silicon-Selenide (SiSe);
   Silicon-Sulfide (SiS);
   Lead-Sulfide (PbS);
   Lead-Selenide (PbSe);
   Lead-Telluride (PbTe);
   Tin-Sulfide (SnS);
   Tin-Selenide (SnSe);
   Tin-Telluride (SnTe);
   Zinc-Sulfide (ZnS);
   Zinc-Selenide (ZnSe);
   Cadmium-Sulfide (CdS);
   Cadmium-Selenide (CdSe);
   Copper (Cu);
   Silver (Ag);
   Zinc (Zn);
   Lithium (Li); and
   Sodium (Na).

10. Method as claimed in claim 1, wherein the electrode element includes at least one of:
    Copper (Cu);
    Silver (Ag);
    Zinc (Zn);
    Lithium (Li); and
    Sodium (Na).

11. Method for fabricating an integrated device, comprising:
    providing a substrate, including an electrode element;
    providing a solid electrolyte element coupled to the electrode element, thereby forming a programmable resistance element, wherein providing the solid electrolyte element comprises:
       providing the solid electrolyte element in an amorphous state; and
       rendering the solid electrolyte element crystalline; and
    applying a heating process, after providing the solid electrolyte element, wherein the heating process comprises a temperature change ranging from 5 to 100 Kelvin per second.

12. Method as claimed in claim 11, wherein providing the solid electrolyte element comprises implanting a metal into the solid electrolyte element.

13. Method as claimed in claim 12, wherein implanting a metal into the solid electrolyte element comprises:
    providing a metal adjacent to the solid electrolyte element;
    driving the metal into the solid electrolyte element; and
    removing the metal adjacent to the solid electrolyte element.

14. Method as claimed in claim 11, wherein rendering the solid electrolyte crystalline comprises a rapid temperature process with a pre-determined temperature profile versus time.

15. Method as claimed in claim 14, wherein the temperature profile comprises a heating stage with at least one heating rate ranging from 5 to 100 Kelvin per second.

16. Method as claimed in claim 14, wherein the temperature profile comprises a temperature plateau stage and the duration of the plateau ranges from 5 to 400 seconds.

17. Method as claimed in claim 14, wherein the temperature profile comprises a temperature plateau stage and the hold temperature ranges from 400° to 700°.

18. Method as claimed in claim 14, wherein the temperature profile comprises a cooling stage with at least one cooling rate ranging from 5 to 100 Kelvin per second.

19. Method as claimed in claim 11, wherein the solid electrolyte element is rendered mono-crystalline.

20. Method as claimed in claim 11, wherein the solid electrolyte element is rendered poly-crystalline.

21. Method as claimed in claim 11, wherein the solid electrolyte element is rendered nano-crystalline.

22. Method as claimed in claim 11, wherein the method for fabricating the integrated device is embedded into a CMOS fabricating process.

23. Method for fabricating an integrated device, comprising:
    providing a substrate, including an electrode element;

providing a solid electrolyte element coupled to the electrode element, thereby forming a programmable resistance element, wherein providing the solid electrolyte element comprises:
   providing the solid electrolyte element in an amorphous state; and
   rendering the solid electrolyte element crystalline; and
applying a heating process, after providing the solid electrolyte element;
wherein providing the solid electrolyte element comprises implanting a metal into the solid electrolyte element, wherein implanting a metal into the solid electrolyte element comprises:
   providing a metal adjacent to the solid electrolyte element;
   driving the metal into the solid electrolyte element; and
   removing the metal adjacent to the solid electrolyte element.

24. Method for fabricating an integrated device, comprising:
providing a substrate, including an electrode element;
providing a solid electrolyte element coupled to the electrode element, thereby forming a programmable resistance element, wherein providing the solid electrolyte element comprises:
   providing the solid electrolyte element in an amorphous state; and
   rendering the solid electrolyte element crystalline; and
applying a heating process, after providing the solid electrolyte element;
wherein rendering the solid electrolyte crystalline comprises a rapid temperature process with a pre-determined temperature profile versus time, the temperature profile comprising a heating stage, a temperature plateau stage and a cooling stage.

25. Method as claimed in claim 24, wherein the heating stage comprises at least one heating rate ranging from 5 to 100 Kelvin per second.

26. Method as claimed in claim 24, wherein the temperature plateau stage comprises a duration of the plateau ranging from 5 to 400 seconds.

27. Method as claimed in claim 24, wherein the temperature plateau stage comprises a hold temperature ranging from 400° to 700°.

28. Method as claimed in claim 24, wherein the cooling stage comprises at least one cooling rate ranging from 5 to 100 Kelvin per second.

* * * * *